United States Patent [19]
Tchon

[11] 4,040,077
[45] Aug. 2, 1977

[54] TIME-INDEPENDENT CCD CHARGE AMPLIFIER

[75] Inventor: Wallace Edward Tchon, Phoenix, Ariz.

[73] Assignee: Honeywell Information Systems, Inc., Phoenix, Ariz.

[21] Appl. No.: 715,271

[22] Filed: Aug. 18, 1976

[51] Int. Cl.² .................... H01L 29/78; G11C 19/28; H01L 29/04
[52] U.S. Cl. ................................ 357/24; 307/221 D; 357/59
[58] Field of Search .............. 357/24; 307/221 D, 304

[56] References Cited
U.S. PATENT DOCUMENTS

| | | | |
|---|---|---|---|
| 3,760,202 | 9/1973 | Kosonocky | 357/24 |
| 3,986,198 | 10/1976 | Kosonocky | 357/24 |

OTHER PUBLICATIONS
Sequin et al. *Charge Transfer Devices* Academic Press, N. Y. July 1975, pp. 25–27, 58, 59.

*Primary Examiner*—William D. Larkins
*Assistant Examiner*—Gene M. Munson
*Attorney, Agent, or Firm*—Walter W. Nielsen; William W. Holloway, Jr.

[57] ABSTRACT

A time-independent CCD charge amplifier comprises first and second CCD lines each having a plurality of electrode pairs disposed over a layer of silicon dioxide overlying a semiconductor substrate. Two clocks which are in a predetermined phase relationship with respect to one another are connected to alternate electrode pairs. The second CCD line further comprises a clocked-source charge injector, the input gate of which is electrically coupled to the signal source, which in a preferred embodiment comprises a surface potential tap in the first CCD line. According to a preferred embodiment, charge is non-destructively sampled from the first CCD line and is amplified by a predetermined factor in the second CCD line.

9 Claims, 9 Drawing Figures

TIME-INDEPENDENT CCD CHARGE AMPLIFIER

CROSS-REFERENCE TO RELATED INVENTIONS

The present invention is related to the following inventions, all assigned to the same assignee as the present invention:
1. "Charge Injectors for CCD Registers", Ser. No. 592,147, filed June 30, 1975, now U.S. Pat. No. 3,980,902, issued Sept. 14, 1976, of W. E. Tchon.
2. "Charge Detectors for CCD Registers", Ser. No. 591,667, filed June 30, 1975, of B. R. Elmer et al.
3. "Charge Multiplying Differential Amplifier", Ser. No. 644,655, filed Dec. 29, 1975, of W. E. Tchon et al.
4. "Time-Independent Circuit for Multiplying and Adding Charge", Ser. No. 715,270, filed on even date herewith, of W. E. Tchon.

BACKGROUND OF THE INVENTION

The invention relates generally to charge transfer devices and, more particularly, to a time-independent charge-coupled device (CCD) charge amplifier.

The basic operation of charge-coupled devices has been explained in detail in the technical and patent literature, but a brief summary of the operation of such devices may facilitate an understanding of the present invention. While the structure of a charge-coupled device will be given in terms of specific semiconductor material types, it will be understood that in general where P-type material is specified, N-type material may be substituted and vice versa.

A typical charge-coupled device may consist of a P-type silicon substrate (in which electrons are normally the minority signal carriers) with a silicon dioxide insulating layer superimposed on its surface. An arrangement of conducting electrodes is deposited on the surface of the insulation layer.

When clock voltages are applied to predetermined groupings of the electrodes, some of the electrons in the vicinity of each electrode, assuming that electrons are initially present (as a result, for example, of injection into the device), will form a discrete packet of charge and move one charge-coupled element, or unit cell, in a predetermined direction for each full clock cycle. The packets of charge move in the predetermined direction as a result of the continuous lateral displacement of the local potential well in which they find themselves. Charge-coupling is thus the collective transfer of all the mobile electric charge stored within a semiconductor storage region to a similar, adjacent storage region by the external manipulation of clock voltages.

The quantity of charge capable of being stored in the mobile packet can vary widely, depending on the applied voltages and on the capacitance of the storage regions. The amount of electric charge in each packet can represent information. Charge-coupled devices have utility in photosensor arrays, delay lines, shift registers, buffer memories, sequential-access memories, fast-access scratchpad memories, refresh memories, and other information storage and transfer mechanisms.

Various types of CCD charge amplifiers are known in the prior art. One type commonly used is the floating gate MOSFET sense amplifier. In the floating gate amplifier a floating gate electrode located above the active CCD channnel senses the magnitude of the signal charge packet. The floating gate in turn is connected to a high impedance amplifier, such as the gate of a MOSFET device. The floating gate CCD charge amplifier is described in *Charge Transfer Devices*, Sequin and Tompsett, Academic Press Inc., New York, 1975, at pp. 52–58.

Another known type of CCD amplifier, also described in the foregoing publication, is the charge-coupled distributed amplifier, by means of which charge packets are non-destructively sampled at several points along a first CCD line, individually amplified, and combined in a second, larger CCD line. The charge-coupled distributed amplifier illustrated in the foregoing publication utilizes floating gates to detect the charge packets in the first CCD line. A similar-coupled distributed amplifier is described in U.S. Pat. No. 3,806,772. The aforementioned types of CCD charge amplifiers have the disadvantage of being frequency dependent, since they must integrate charge over a fixed period of time.

SUMMARY OF THE INVENTION

According to a preferred embodiment of the present invention, a time-independent CCD charge amplifier is disclosed which overcomes certain disadvantages of the known prior art CCD charge amplifiers.

The present invention comprises a first CCD line and a second CCD line arranged on a common semiconductor substrate. Charge packets which are input into the first and second CCD lines are caused to move in synchronization through the first and second CCD lines by means of a two-clock system. An input gate in the second CCD line is electrically connected to a surface potential tap on one of the charge storage regions of the first CCD line. The signal sensed at the surface potential tap is amplified in the second CCD line by a predetermined factor which is substantially independent of the operational frequency.

OBJECTS OF THE INVENTION

Accordingly, it is a principal object of the present invention to provide an improved CCD charge amplifier.

It is another object of the invention to provide a time-independent CCD charge amplifier.

It is also an object of the invention to provide a time-independent CCD charge amplifier which samples charge from a CCD line in a non-destructive manner and amplifies it by a predetermined factor which is substantially independent of the operational frequency.

BRIEF DESCRIPTION OF THE DRAWINGS

The invention will be described with reference to the accompanying drawings, wherein.

DETAILED DESCRIPTION OF THE PREFERRED EMBODIMENT

Figure 1:
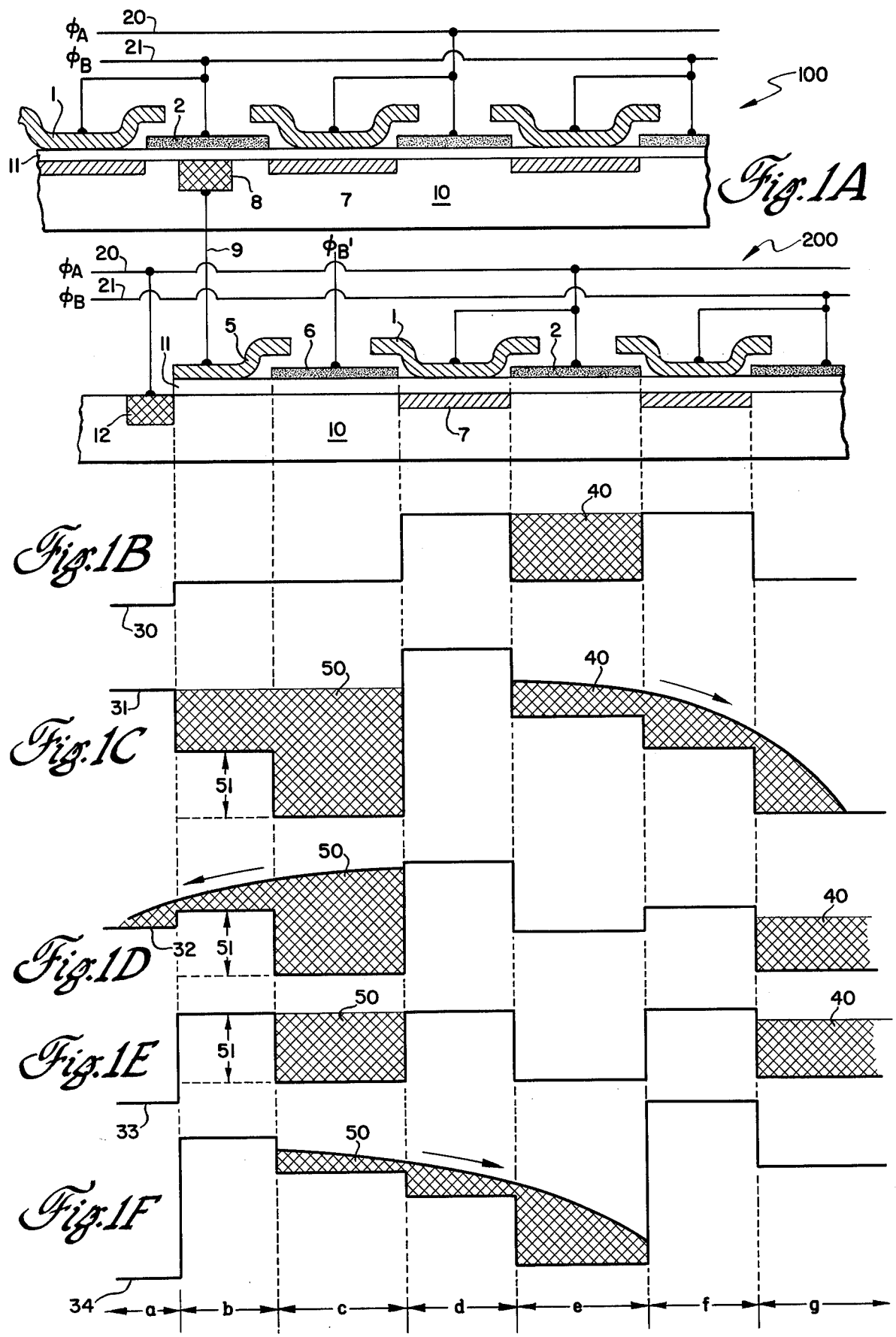
FIG. 1A is a schematic showing a cross-section of a portion of a time-independent CCD charge amplifier illustrating a preferred embodiment of the invention.
FIGS. 1B–1F illustrate the operation of a preferred embodiment of the time-independent CCD charge amplifier and include the surface potential profiles corresponding to certain times of the waveforms illustrated in FIG. 2.

Referring now to FIG. 1A, a schematic of a cross-section of a portion of a time-independent CCD charge amplifier 200 is illustrated. Charge amplifier 200 is shown connected to a portion of a first CCD line 100, whose signal content is to be amplified by charge amplifier 200. CCD line 100 may be of conventional construction. In the preferred embodiment, CCD line 100 comprises a semiconductor substrate 10 of P-type semiconductor material, a thin layer of silicon dioxide 11, and a plurality of electrode pairs each comprising a first electrode member 1 of second-layer polysilicon and a second electrode member 2 of first-layer polysilicon. Other well-known CCD structures are possible. The first CCD line 100 is driven by a two-phase clock comprising clock signal $\phi_A$ transmitted over line 20 and clock signal $\phi_B$ transmitted over line 21. Alternate electrode pairs are connected to a first one of the clock lines, and the remaining electrode pairs are connected to the other clock line.

The two members of each electrode pair are electrically isolated from one another by an insulative layer of silicon dioxide (not shown), which layer is grown as a normal part of the known silicon gate process. The electrode pairs comprise polysilicon (polycrystalline silicon which has been diffused with impurity atoms) in the preferred embodiment. The composition of the electrodes could alternatively be metal, such as aluminum or gold.

Beneath the first electrode member 1 of each electrode pair is a P+ barrier region 7. The doping density of the barrier region 7 in the preferred embodiment is approximately $10^{17}$ atoms/cm$^3$ and may be of a boron dose of approximately $2 \times 10^{12}$ atoms/cm$^2$ to the substrate 10. At any desired charge storage region (i.e., that region beneath any of the second electrode members 2) of the first CCD line 100 a surface potential tap in the form of an N++ diffusion region 8 may be made in order to sample non-destructively the signal momentarily stored at such region and to amplify same in the charge amplifier 200. The N++ region 8 may be formed by diffusing phosphorous atoms, for example, into the P-type silicon substrate in standard doping densities (e.g., $10^{19}$ to $10^{21}$ atoms/cm$^3$). In the preferred embodiment, the N++ diffusion region 8 is doped to approximately $10^{20}$ atoms/cm$^3$. The specific process steps required to produce the P+ and N++ regions will be apparent to one skilled in the art.

Connected to the N++ diffusion region 8 of CCD line 100 by means of a suitable connecting line 9 is the time-independent CCD charge amplifier 200 of the present invention. Like CCD line 100, charge amplifier 200 comprises a semiconductor substrate 10 of P-type semiconductor material, a thin layer of silicon dioxide 11, and a plurality of electrode pairs, each comprising a first electrode member 1 formed of second-layer polysilicon and a second electrode member 2 formed of first-layer polysilicon. It will be apparent to one skilled in the art that alternative charge transfer structures may be utilized in constructing the charge amplifier 200. Charge amplifier 200 further comprises an input gate 5 formed of second-layer polysilicon and connected by line 9 to N++ region 8 of the tapped charge storage region of CCD line 100. A first charge storage electrode 6 formed of first-layer polysilicon is located between input gate 5 and the first electrode member 1 of the first electrode pair of charge amplifier 200. An N++ diffusion region 12 is located in the substrate 10 adjacent to input gate 5.

The CCD line 100 and the charge amplifier 200 may be driven by the same two-clock system comprising a first clock $\phi_A$ transmitted over line 20 and a second clock $\phi_B$ transmitted over line 21. With respect to the charge amplifier 200, the first electrode pair, as well as the other odd-numbered electrode pairs, are connected to clock line 20, while the remaining even-numbered electrode pairs are connected to clock line 21. The N++ diffusion region 12 is connected to clock line 20, and the first charge storage electrode 6 is connected to a modified $\phi_B$ clock line $\phi_B$, the purpose of which will be discussed below. The optimum manner for connecting the clock lines to the various components of CCD line 100 and charge amplifier 200 will be apparent to the practitioner of ordinary skill. Also throughout the description of the present invention, the various steps involved in manufacturing the device such as masking, etching, oxide formation, ion implantation, diffusion, and so forth will not be discussed individually in detail, since they are individually known in the semiconductor technology and as such form no part of the present invention.

Figure 2:
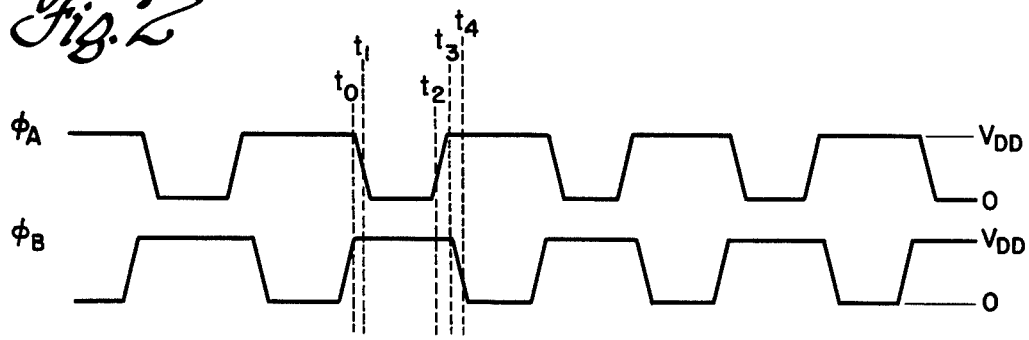

The operation of the preferred embodiment of the time-independent CCD charge amplifier will now be explained with reference to FIGS. 1A-1F and FIG. 2. FIG. 2 illustrates the relationship of clock waveforms $\phi_A$ and $\phi_B$ to one another. FIGS. 1B-1F illustrate the surface potential profiles during times $t_0-t_4$ respectively of a complete clock cycle. The surface potential profiles 30-34 of FIGS. 1B-1F respectively represent the surface potential along the interface between the substrate 10 and thin oxide layer 11. Potential profiles 30-34 outline the depth of the potential wells which are formed as a result of the particular configuration of polysilicon electrodes, P+ and N++ regions, oxide thickness, and the applied clock voltages. The depth of the potential wells formed at the surface of the substrate depends upon the magnitude of the voltage applied to the electrodes or gates, upon the oxide thickness, upon the doping densities of the substrate, P+ regions, and N++ region, upon the work functions of the substrate and the electrodes, and upon the surface states $Q_{SS}$. In general, the greater the voltage applied to the electrode or gate, the deeper is the potential well beneath such structure.

The effect of the P+ barrier regions 7 upon the surface potential profile is to produce an elevation in the surface potential profile due to the presence of a relatively greater number of dopant atoms as compared to the surrounding P-type substrate material. That is, the P+ regions 7 have a higher threshold voltage than the P-type substrate 10. The effect which the N++ regions 8 have upon the potential profile is to form regions of high conductivity due to the presence of a high number of minority carriers in these regions.

Examining the potential profiles now in greater detail, and FIG. 1B in particular which corresponds to time $t_0$ in FIG. 2 (i.e., clocks $\phi_A$ and $\phi_B$ are both "on", as represented by a positive 12 volts) portions $d$ and $f$ are seen to be the highest parts of the profile. This is because of the presence of the P+ barrier regions 7 located beneath electrode members 1 of the two electrode pairs 1, 2 illustrated. The charge packet 40, illustrated by the cross-hatched area between the surface potential barriers corresponding to the P+ barrier regions 7, represents an amplified arithmetic 1 which is being propagated through the CCD output portion of charge amplifier 200 as a result of an amplification operation which took place at an earlier portion of the complete clock cycle, which operation will be discussed below.

Figure 3:
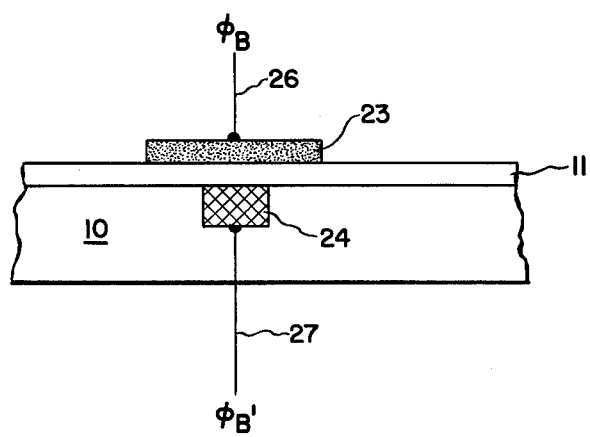
FIG. 3 is a schematic showing a cross-section of a portion of a preferred embodiment of the present invention which is used to generate an offset voltage.

With reference to FIG. 1B, it is desirable for portions $b$ and $c$ of surface potential profile 30 to be substantially identical for the condition when a 0 is momentarily stored in the tapped charge storage region of CCD line 100. They would not ordinarily be at the same level, even if it is assumed that the threshold voltages of the first and second polysilicon layers are identical, since the voltages applied to them are not identical. If it is assumed that a 0 is being stored momentarily in the tapped charge storage region of CCD line 100, the voltage applied to input gate 5 of charge amplifier 200 is approximately equal to the voltage applied over line 21 to the electrode member 2 of CCD line 100 situated above the tapped charge storage region minus the threshold voltage of electrode member 2. In order to make the voltage applied to the first charge storage electrode 6 of charge amplifier 200 identical to that applied to the input gate 5, a $\phi_B$, modified clock voltage is generated by means of a dummy cell, such as that illustrated in FIG. 3, and applied to electrode 6. The dummy cell illustrated in FIG. 3 comprises a P-type semiconductor substrate 10, which may be identical to that earlier described with respect to CCD line 100 and charge amplifier 200, a thin oxide layer 11, a first-layer polysilicon electrode 23 to which clock $\phi_B$ is applied, and an N++ diffusion region 24 beneath electrode 23 from which the desired $\phi_B$, modified clock voltage is obtained. This dummy cell may be located on the same substrate 10 or on a different substrate.

Alternatively, the surface potentials beneath electrodes 5 and 6 could be equalized by making an appropriate implant of diffusion beneath one of the electrodes 5 or 6. As a second alternative, the first storage electrode 6 could be connected directly to the $\phi_B$ line 121, and the resulting step in the surface potential profile above region $b$, which would have the effect of propagating a non-zero value through the CCD portion of charge amplifier 200 notwithstanding the sensing of a 0 at input gate 5, could be compensated for by appropriate circuitry for discriminating between 1's and 0's at the output end of charge amplifier 200.

Lastly, still with reference to FIG. 1B it will be noted that the surface potential in region $a$ is somewhat lower than that in regions $b$, $c$, $e$, and $g$ due to the presence of the N++ diffusion region 12 which is connected directly to the full clock voltage $\phi_A$.

With reference now to FIG. 1C, surface potential profile 31 illustrates the filling of the charge storage region $c$ beneath the first charge storage electrode 6 with a large amount of injected charge 50 represented by cross-hatching, as well as the forward propagation of charge packet 40 as charge storage region $e$ rises with respect to barrier $f$ as clock $\phi_A$ turns "off". With clock $\phi_A$ "off", a large quantity of minority charge 50 is injected over clock line 20 into regions $b$ and $c$, which charge quantity 50 is prevented from advancing through the CCD portion of charge amplifier 200 by the forward-blocking action of barrier region $d$. At time $t_1$, the surface potential beneath input gate 5 is either low or at a medium height, the medium and low positions of the surface potential being indicated by the double-pointed arrow 51. When a 0 is present in the tapped charge storage region of CCD line 100, substantially no voltage is transmitted over line 9 to input gate 5, and thus the surface potential of region $b$ will be at its lower level. On the other hand if a 1 is stored in the tapped charge storage region of CCD line 100, the voltage transmitted over line 9 to input gate 5 will be at some positive voltage level, which causes the surface potential of region $b$ to be at a medium level.

Referring now to FIG. 1D, which corresponds to the surface potential at time $t_2$ of the complete clock cycle shown in FIG. 2, clock $\phi_B$ is "on" and clock $\phi_A$ is turning "on". The charge packet 40 is prevented from moving back into the deepening charge storage region $e$ by barrier region $f$. With the clocked source (N++ region 12) turning "on", any excess charge in the injected charge packet 50 flows back into the input region $a$. The amount of charge retained in region $c$ is determined by whether the barrier $b$ is at its medium level (representing a transmitted 1) or low (representing a transmitted 0).

As shown in FIG. 1E, which corresponds to time $t_3$ (phase $\phi_A$ and phase $\phi_B$ are both "on") a charge packet 50 is resident in the first charge storage region $c$. Charge packet 50 equals the size of the charge packet which was initially present in the tapped charge storage region of CCD line 100 multiplied by a certain factor, which factor is a function of the size of the first charge storage region $c$ of charge amplifier 200. It will be apparent that the amplification factor may be either greater or less than unity.

FIG. 1F shows the dynamic condition of the potential profile at time $t_4$ (i.e., when phase $\phi_A$ is "on" and phase $\phi_B$ is turning "off"). Charge packet 50 is moved to the right into charge storage region $e$ by virtue of the surface potential rising in regions $b$ and $c$, and charge packet 50 is prevented from moving further forward by the forward-blocking action of barrier region $f$. This completes the discussion of the operation of the charge amplifier 200 during one complete clock cycle. It should be noted that there are complicated dynamic interactions between the various barrier regions because of the fact that the clocked source returns to its initial state. The various intermediary values of the surface potential are lost since the capacitive voltages return to their initial conditions.

With respect to FIGS. 1C, 1D, and 1F, it should be noted that the changing of the clock voltages which effect the barrier levels and the movement of charge from one region to another does not occur instantaneously, in order to provide time for the charge to flow in the desired direction.

Figure 4:
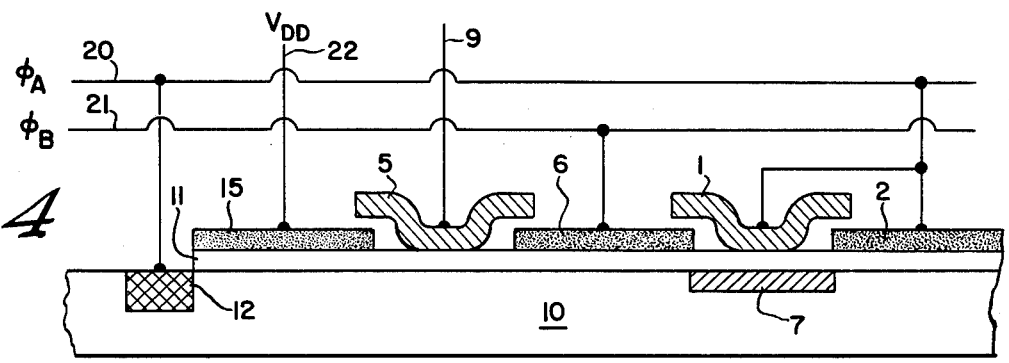
FIG. 4 is a schematic showing a cross-section of a portion of a time-independent CCD charge amplifier illustrating an alternative embodiment of the invention.

An alternative embodiment of the time-independent CCD charge amplifier is shown in FIG. 4. This embodiment differs from the preferred embodiment in that an additional gate 15 of first-layer polysilicon is interposed between the N++ diffusion region 12 and the input gate 5, such additional gate 15 being connected to supply voltage $V_{DD}$. The purpose of this embodiment is to reduce the effects of capacitive coupling between the N++ region 12 and the input gate 5.

Typical values for the dimensions of the various elements of the preferred embodiments shown in FIG. 1A are 3,000A for the polysilicon electrodes and 1,000A for the thin oxide layer. It will be understood that these values are not necessarily optimized, and that one skilled in the art will be capable of making many modifications to the preferred embodiments according to the desired performance requirements. It should also be understood that the relative dimensions of the various elements in the drawing are not to be considered relatively proportional, as they have been distorted for ease in understanding the invention.

It will be apparent to those skilled in the art that the disclosed time-independent CCD charge amplifier may be modified in numerous ways and may assume many embodiments other than the forms specifically set out and described above. For example, a capacitive coupling may be substituted for the direct electrical connection 9 (FIGS. 1A and 3) resulting in a device superficially resembling a floating gate type amplifier but being time-independent in operation. Also the N++ conduction regions can be formed either through a diffusion or an ion implant process step. In addition, it will be apparent that charge pumping effects in the dummy cell shown in FIG. 3 can be appropriately compensated for.

It will also be apparent that several CCD charge amplifiers may be connected at various points along CCD line 100. If the outputs of such a plurality of amplifiers are appropriately injected into a second CCD line, the signals propagated through CCD line 100 will be successively amplified in the second CCD line, since the output of each additional CCD charge amplifier is added to the accumulated charge packet transmitted by the previous CCD charge amplifiers. In this manner, charge may be substantially amplified above the initial signal level. In addition, by utilizing different amplification factors in the CCD charge amplifiers, and combining the outputs of the charge amplifiers appropriately, arithmetic, logic, and complex mathematical algorithms and signal processing operations may be carried out, as described in related invention No. 4. While the operation of the present invention has been explained using arithmetic 1's and 0's it should be understood that the invention is fully capable of processing both analog and digital signals.

Accordingly, it is intended by the appended claims to cover all modifications of the invention which fall within the true sprirt and scope of the invention.

What is claimed is:

1. A time-independent charge-coupled device charge amplifier comprising
   a substrate of a given type of semiconductor material,
   a layer of silicon dioxide overlying said substrate,
   a plurality of first electrode pairs overlying a first portion of said silicon dioxide layer, each of said first electrode pairs comprising a charge transfer electrode and a charge storage electrode, said plurality of first electrode pairs being arranged to form a first charge-coupled device,
   a plurality of clock drivers, a first one of said clock drivers being connected to alternate ones of said first electrode pairs and a second one of said clock drivers being connected to the remaining ones of said first electrode pairs,
   a first conduction region in said substrate underlying the charge storage electrode of one of said first electrode pairs, said first conduction region comprising semiconductor material of an opposite conductivity type from that of said substrate,
   a plurality of second electrode pairs overlying a second portion of said silicon dioxide layer, each of said second electrode pairs comprising a charge transfer electrode and a charge storage electrode, said plurality of said second electrode pairs being arranged so as to form a second charge-coupled device, said first one of said clock drivers being connected to alternate ones of said second electrode pairs and said second one of said clock drivers being connected to all but one of the remaining ones of said second electrode pairs,
   a second conduction region in said substrate and located adjacent to the charge transfer electrode of said one of said second electrode pairs, said second conduction region comprising semiconductor material of an opposite conductivity type from that of said substrate, said second conduction region being connected to said first one of said clock drivers,
   means for electrically connecting said first conduction region with said charge transfer electrode of said one of said second electrode pairs, and
   means for electrically connecting said charge storage electrode of said one of said second electrode pairs with said second one of said clock drivers through an offset circuit comprising
      an additional electrode on a third portion of said silicon dioxide layer,
      a third conduction region in said substrate and located beneath said additional electrode, said third conduction region comprising semiconductor material of an opposite conductivity type from that of said substrate,
      means for electrically connecting said additional electrode to said second one of said clock drivers, and
      means for electrically connecting said third conduction region to said charge storage electrode of said one of said second electrode pairs.

2. The time-independent charge-coupled device charge amplifier recited in claim 1 wherein said substrate is formed of N type semiconductor material, and said first, second, and third conduction regions are formed of P++ type semiconductor material.

3. The time-independent charge-coupled device charge amplifier recited in claim 1 wherein said substrate is formed of P type semiconductor material, and said first, second, and third conduction regions are formed of N++ type semiconductor material.

4. The time-independent charge-coupled device charge amplifier recited in claim 1 wherein said substrate comprises charge transfer regions beneath the charge transfer electrodes of said first charge-coupled device formed of semiconductor material of the same type as said substrate but containing a different concentration of impurity atoms.

5. The time-independent charge-coupled device charge amplifier recited in claim 4 wherein said charge transfer regions comprise N+ type semiconductor material.

6. The time-independent charge-coupled device charge amplifier recited in claim 4 wherein said charge transfer regions comprise P+ type semiconductor material.

7. The time-independent charge-coupled device charge amplifier recited in claim 4 wherein said substrate further comprises charge transfer regions beneath the charge transfer electrodes of said second charge-coupled device formed of semiconductor material of the same type as said substrate but containing a different concentration of impurity atoms.

8. The time-independent charge-coupled device charge amplifier recited in claim 1 wherein said means for electrically connecting said first conduction region with said charge transfer electrode of said one of said second electrode pairs comprises capacitive means.

9. The time-independent charge-coupled device charge amplifer recited in claim 1 and further comprising an additional electrode on said second portion of said silicon dioxide layer and located between said second conduction region and the charge transfer electrode of said one of said second electrode pairs, and means for electrically connecting said additional electrode to one of the supply voltages of said amplifier.

* * * * *